(12) United States Patent
Isago (10) Patent No.: US 11,367,595 B2
(45) Date of Patent: Jun. 21, 2022

(54) PLASMA PROCESSING APPARATUS

(71) Applicant: Tokyo Electron Limited, Tokyo (JP)

(72) Inventor: Masaru Isago, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 167 days.

(21) Appl. No.: 16/011,988

(22) Filed: Jun. 19, 2018

(65) Prior Publication Data
US 2018/0374722 A1 Dec. 27, 2018

(30) Foreign Application Priority Data

Jun. 23, 2017 (JP) .............................. JP2017-122877

(51) Int. Cl.
*H01J 37/32* (2006.01)
*C23C 16/511* (2006.01)
(Continued)

(52) U.S. Cl.
CPC .... *H01J 37/32513* (2013.01); *C23C 16/4401* (2013.01); *C23C 16/4404* (2013.01); *C23C 16/4412* (2013.01); *C23C 16/4586* (2013.01); *C23C 16/509* (2013.01); *C23C 16/511* (2013.01); *H01J 37/32458* (2013.01);
(Continued)

(58) Field of Classification Search
CPC ........... H01L 21/67063; H01L 21/3065; H01L 21/67126; H01L 21/6719; H01L 21/6875; H01L 21/68785; C23C 16/511; C23C 16/509; C23C 16/4586; C23C 16/4412; C23C 16/4404; C23C 16/4401; C23C 16/4409; H01J 37/32513; H01J 37/32889; H01J 37/32899; H01J 37/32458
See application file for complete search history.

(56) References Cited

U.S. PATENT DOCUMENTS 6,561,484 B2 * 5/2003 Nakagawa .............. F16K 3/188
251/175
2004/0083978 A1 * 5/2004 Welch ............... H01J 37/32458
118/733

(Continued)

FOREIGN PATENT DOCUMENTS

CN      101842514 A     9/2010
JP      2005-252201 A   9/2005

(Continued)

*Primary Examiner* — Benjamin Kendall
(74) *Attorney, Agent, or Firm* — Pearne & Gordon LLP (57) ABSTRACT

A plasma processing apparatus capable of achieving a uniform plasma space therein is provided. The plasma processing apparatus includes a processing vessel, a mounting table, a shield member, a shutter for an opening configured to be moved up and down, a first driving unit and a second driving unit. The processing vessel has a sidewall, and the sidewall is provided with a transfer path through which a processing target object is carried-in/carried-out. The mounting table is provided within the processing vessel. The shield member is provided along an inner surface of the sidewall to surround the mounting table and provided with an opening facing the transfer path. The first driving unit is configured to move the shutter up and down. The second driving unit is configured to move the shutter in a forward-backward direction with respect to the shield member.

10 Claims, 6 Drawing Sheets

(51) Int. Cl.
*H01L 21/687* (2006.01)
*C23C 16/44* (2006.01)
*H01L 21/67* (2006.01)
*C23C 16/509* (2006.01)
*C23C 16/458* (2006.01)

(52) U.S. Cl.
CPC .... *H01L 21/6719* (2013.01); *H01L 21/67126* (2013.01); *H01L 21/68785* (2013.01)

(56) References Cited

U.S. PATENT DOCUMENTS

| | | | |
|---|---|---|---|
| 2004/0245489 A1* | 12/2004 | Kurita | F16K 3/188 |
| | | | 251/195 |
| 2005/0193953 A1* | 9/2005 | Makino | H01J 37/32522 |
| | | | 118/733 |
| 2009/0114153 A1* | 5/2009 | Kurita | C23C 16/54 |
| | | | 118/722 |
| 2010/0327203 A1* | 12/2010 | Nagai | F16K 3/06 |
| | | | 251/193 |
| 2013/0162142 A1* | 6/2013 | Nishino | H05H 1/46 |
| | | | 315/111.21 |
| 2015/0129129 A1* | 5/2015 | Shimizu | H01J 37/32651 |
| | | | 156/345.3 |

FOREIGN PATENT DOCUMENTS

| | | |
|---|---|---|
| JP | 2010-121216 A | 6/2010 |
| JP | 2014-016035 A | 1/2014 |
| JP | 2015-095543 A | 5/2015 |
| WO | 2009/058562 A1 | 5/2009 |

\* cited by examiner

PLASMA PROCESSING APPARATUS

CROSS-REFERENCE TO RELATED APPLICATION

This application claims the benefit of Japanese Patent Application No. 2017-122877 filed on Jun. 23, 2017, the entire disclosures of which are incorporated herein by reference.

TECHNICAL FIELD

The embodiments described herein pertain generally to a plasma processing apparatus.

BACKGROUND

In the manufacture of an electronic device such as a semiconductor device, a plasma processing is performed on a processing target object by using a plasma processing apparatus. The plasma processing includes various processings such as film formation and etching by plasma of a processing gas.

The plasma processing apparatus used in the plasma processing is equipped with a processing vessel having a plasma processing space formed therein. A transfer path for carry-in/out of the processing target object is formed at a sidewall of the processing vessel. Further, a shield member (deposition shield) configured to protect an inner surface of the sidewall of the processing vessel is provided along the corresponding inner surface of the sidewall. This shield member is provided with an opening for the carry-in/out of the processing target object, and this opening of the shield member faces the transfer path. Further, a shutter configured to be moved up and down to open/close the opening of the shield member is provided between the inner surface of the sidewall and the shield member. The shutter comes into contact with only a contact portion of the shield member when it closes the opening of the shield member. The contact portion is made of an alloy having conductivity. This plasma processing apparatus is described in, for example, Japanese Patent Laid-open Publication No. 2015-095543 (Patent Document 1).

Patent Document 1: Japanese Patent Laid-open Publication No. 2015-095543

SUMMARY

In the plasma processing apparatus disclosed in Patent Document 1, an electrical connection between the shutter and the shield member is stabilized by forming the contact portion between the shutter and the shield member with the alloy. Such electrical stabilization contributes to formation of a uniform plasma space. In the plasma processing apparatus described in Patent Document 1, however, there is still a room for improvement in forming a more uniform plasma space. In this regard, in the relevant technical filed, there is still a demand for a plasma processing apparatus capable of forming a uniform plasma space.

In one exemplary embodiment, there is provided a plasma processing apparatus configured to perform a plasma processing on a processing target object. The plasma processing apparatus includes a processing vessel, a mounting table, a shield member, a shutter for the opening configured to be moved up and down, a first driving unit and a second driving unit. The processing vessel has a sidewall, and the sidewall is provided with a transfer path through which the processing target object is carried-in/carried-out. The mounting table is provided within the processing vessel. The shield member is provided along an inner surface of the sidewall to surround the mounting table and provided with an opening facing the transfer path. The first driving unit is configured to move the shutter up and down. The second driving unit is configured to move the shutter in a forward-backward direction with respect to the shield member.

In the plasma processing apparatus according to the exemplary embodiment, the shutter is moved up and down by the first driving unit and also moved by the second driving unit in the forward-backward direction with respect to the shield member. For example, when closing the opening, the shutter is moved by the first driving unit up to a position where the shutter faces the opening. At this position, the shutter is moved to approach the shield member by the second driving unit, and is firmly pressed against the shield member. As stated, by providing the second driving unit, the shutter can be brought into contact with the shield member, so that the electrical connection between the shutter and the shield member can be stabilized. Therefore, the uniform plasma space can be formed in the plasma processing apparatus.

The second driving unit may be equipped with a single driving shaft configured to press the shutter. According to this exemplary embodiment, the shutter can be brought into contact with the shield member by the single driving shaft.

The first driving unit may be equipped with an elevation driving shaft connected to a connection portion of the shutter to move the shutter up and down, and the driving shaft may press the connection portion. According to this exemplary embodiment, as compared to the case where a portion of the shutter other than the connection portion is pressed, a stress generated at the connection portion between the shutter and the driving shaft can be reduced.

The second driving unit may be equipped with multiple driving shafts configured to press the shutter. According to the present exemplary embodiment, as compared to the case where the single driving shaft presses the shutter, the shutter can be firmly pressed against the shield member in a uniform manner.

The plasma processing apparatus may further include a conductive member provided at the shield member to surround the opening. According to this exemplary embodiment, the electrical connection between the shutter and the shield member can be further stabilized.

The plasma processing apparatus may further include a conductive member provided at the shutter to surround a region of the shutter corresponding to the opening. According to the present exemplary embodiment, the electrical connection between the shutter and the shield member can be further stabilized.

As stated above, according to the present exemplary embodiment, it is possible to provide the plasma processing apparatus capable of achieving the uniform plasma space therein.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes

DETAILED DESCRIPTION

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, various exemplary embodiments will be described with reference to the accompanying drawings. In the various drawings, same or corresponding parts will be assigned same reference numerals.

Figure 1:
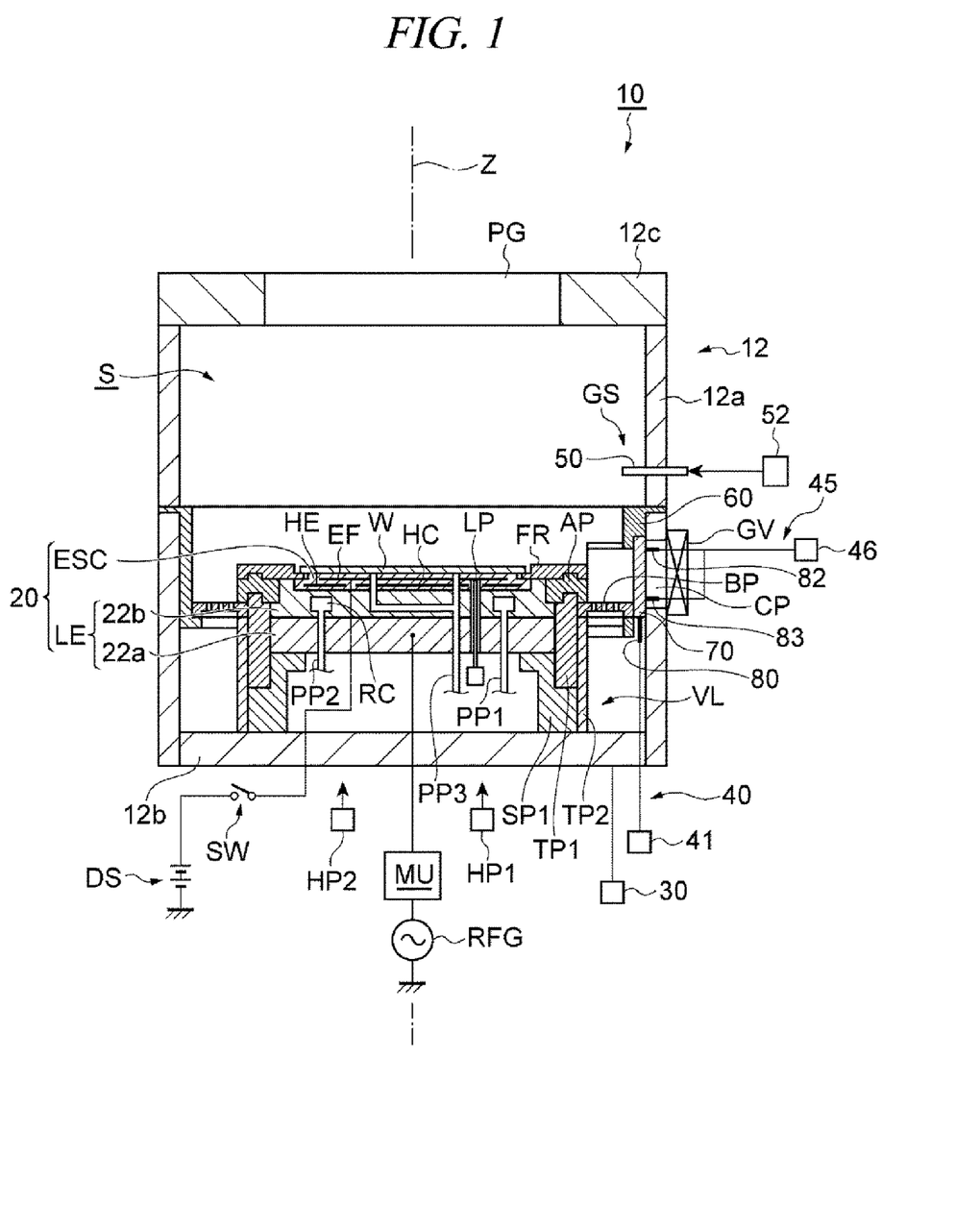
FIG. 1 is a diagram schematically illustrating a plasma processing apparatus according to an exemplary embodiment.

FIG. 1 is a diagram schematically illustrating a plasma processing apparatus according to an exemplary embodiment. In FIG. 1, a longitudinal cross sectional view of the plasma processing apparatus is schematically depicted. A plasma processing apparatus 10 shown in FIG. 1 is configured to perform a plasma processing on a processing target object (hereinafter, referred to as "wafer W").

The plasma processing apparatus 10 is equipped with a processing vessel 12. The processing vessel 12 has a processing space S formed therein. In the plasma processing apparatus 10, the wafer W is accommodated in the processing space S, and the plasma processing is performed on the wafer W.

According to the exemplary embodiment, the processing vessel 12 includes a sidewall 12a, a bottom 12b and a ceiling 12c. The sidewall 12a has a substantially cylindrical shape. The sidewall 12a is vertically extended around an axis Z which is a central axis thereof. Hereinafter, in the present exemplary embodiment, a direction in which the axis Z is extended may sometimes be referred to as "axis Z direction", "vertical direction" or "up and down". Further, a radial direction with respect to the axis Z may be referred to as "diametrical direction". Further, a direction according to an arc around the axis Z may sometimes be referred to as "circumferential direction".

The bottom 12b is provided at a lower end of the sidewall 12a, and the ceiling 12c is provided at an upper end of the sidewall 12a. Further, the sidewall 12a is provided with a transfer path CP through which the wafer W is carried into and out of the processing vessel 12. This transfer path CP is configured to be opened/closed by a gate valve GV.

The plasma processing apparatus 10 is further equipped with a mounting table 20. The mounting table 20 is provided within the processing vessel 12. A shield member 60 is provided along an inner surface of the sidewall 12a of the processing vessel 12 to surround the mounting table 20. The shield member 60 is configured to suppress a reaction product generated by performing the plasma processing from being deposited on the inner surface of the sidewall 12a. The shield member 60 is a substantially cylindrical member, and a central axis thereof substantially coincides with the axis Z. This shield member 60 is provided with an opening OP (see FIG. 2 and FIG. 3) which faces the transfer path CP.

Further, a vertically movable shutter 70 for the opening of the shield member 60 is provided within the processing vessel 12. The shutter 70 is configured to be moved up and down by a driving device 40 (first driving unit).

The driving device 40 is configured to move the shutter 70 up and down along the shield member 60. The driving device 40 is equipped with a driving shaft 80 (elevation driving shaft) and a driving circuit 41. A tip end of the driving shaft 80 is connected to a connection portion of the shutter 70. The driving circuit 41 is configured to output a control signal to the driving shaft 80, so that the driving shaft 80 is moved. The driving shaft 80 moves the shutter 70 up and down in response to the control signal from the driving circuit 41. As a specific example, the shutter 70 is located in a first region when the shutter 70 opens the opening OP with respect to the transfer path CP, e.g., when a carry-in or a carry-out of the wafer W is performed, for example. Meanwhile, when the shutter 70 closes the opening OP, e.g., when the plasma processing is performed, the shutter 70 is located in a second region above the first region.

Further, when located in the second region, the shutter 70 is moved in a forward-backward direction with respect to the shield member 60 by a driving device 45 (second driving unit). The driving device 45 is configured to move the shutter 70 in the forward-backward direction with respect to the shield member 60.

The driving device 45 is equipped with an upper driving shaft 82, a lower driving shaft 83 and a driving circuit 46. The upper driving shaft 82 and the lower driving shaft 83 are placed at positions facing the opening OP of the shield member 60. As a more specific example, the upper driving shaft 82 and the lower driving shaft 83 are disposed within the transfer path CP. The driving circuit 46 is configured to output control signals to the upper driving shaft 82 and the lower driving shaft 83, so that the upper driving shaft 82 and the lower driving shaft 83 are moved. The upper driving shaft 82 and the lower driving shaft 83 are moved toward the opening OP in response to the control signals from the driving circuit 46. Accordingly, the upper driving shaft 82 and the lower driving shaft 83 press the shutter 70 located in the second region toward the shield member 60. The lower driving shaft 83 may be disposed to press the connection portion between the driving shaft 80 and the shutter 70. The shutter 70 located in the second region is firmly pressed against the shield member 60 by the driving device 45. Details of the shield member 60 and the shutter 70 will be described later.

The mounting table 20 includes a lower electrode LE and an electrostatic chuck ESC. The lower electrode LE is connected to a high frequency power supply RFG via a matching unit MU. The high frequency power supply RFG is configured to generate a high frequency power (high frequency bias power) for ion attraction. The electrostatic chuck ESC is provided on the lower electrode LE. The electrostatic chuck ESC is configured to hold the wafer W placed on a top surface thereof by attracting the wafer W with a Coulomb force.

As an example, the lower electrode LE includes a first plate 22a and a second plate 22b. The first plate 22a is a substantially disk-shaped member. Further, the first plate 22a is a conductive member and made of, by way of non-limiting example, aluminum. The first plate 22a is supported by a substantially cylindrical supporting member SP1. The supporting member SP1 is extended upwards from the bottom 12b, and in contact with a peripheral portion of a bottom surface of the first plate 22a. The supporting member SP1 is made of an insulating material such as quartz.

The second plate 22b is provided on the first plate 22a. The second plate 22b is a substantially disk-shaped member. Further, the second plate 22b is a conductive member and made of, by way of example, but not limitation, aluminum. The second plate 22b is electrically connected (conducted) with the first plate 22a.

The first plate 22a is electrically connected with the high frequency power supply RFG via the matching unit MU. The high frequency power supply RFG is configured to output the high frequency bias power having a preset frequency of, e.g., 13.65 MHz suitable for controlling energy of ions attracted into the wafer W. The matching unit MU incorporates therein a matching device configured to match an impedance of the high frequency power supply RFG and an impedance at a load side such as, mainly, the electrode, the plasma and the processing vessel 12. The matching device includes a blocking capacitor for self-bias generation.

A coolant path RC is provided within the second plate 22b. A coolant of a preset temperature, for example, cooling water is supplied into and circulated through the coolant path RC from a chiller unit through pipelines PP1 and PP2. A temperature of the wafer W on the electrostatic chuck ESC can be controlled by the coolant circulated in this way. Further, a heat transfer gas, for example, a He gas from a heat transfer gas supply unit is supplied into a gap between a top surface of the electrostatic chuck ESC and a rear surface of the wafer W through a supply line PP3.

The electrostatic chuck ESC is provided on a top surface of the second plate 22b. The electrostatic chuck ESC has a substantially disk shape. The electrostatic chuck ESC is configured to hold the wafer W by an electrostatic attracting force. For the purpose, the electrostatic chuck ESC includes an electrode film EF embedded in a dielectric film. The electrode film EF is electrically connected with a DC power supply DS via a switch SW. The electrostatic chuck ESC is capable of holding the wafer W on the top surface thereof by attracting the wafer W with the Coulomb force generated by a DC voltage applied from the DC power supply DS.

Further, a heater HC and a heater HE are provided within the dielectric film of the electrostatic chuck ESC. The heater HC is provided in a central region of the electrostatic chuck ESC. The heater HC is connected with a heater power supply HP1. The heater power supply HP1 is configured to supply an AC power to the heater HC. The heater HE is provided at an outer side than the heater HC in the diametrical direction. The heater HE is connected with a heater power supply HP2. The heater power supply HP2 is configured to supply an AC power to the heater HE.

Further, a through hole is formed through the electrostatic chuck ESC and the lower electrode LE in the vertical direction, and a pusher pin LP is inserted through the through hole. When the wafer W is carried in and out, the pusher pin LP is moved up to support the wafer W on an upper end thereof.

Further, a focus ring FR is provided at an outer side than the electrostatic chuck ESC in the diametrical direction. The focus ring FR is extended in a ring shape along an edge of the electrostatic chuck ESC and an edge of the wafer W to surround the electrostatic chuck ESC. The focus ring FR is made of a dielectric material such as quartz. The focus ring FR is configured to adjust a sheath potential at an outside of the edge of the wafer W, and contribute to uniformity of the plasma processing on the wafer W within a surface thereof.

A barrel-shaped portion TP1 is provided under the focus ring FR. The barrel-shaped portion TP1 is made of an insulating material such as alumina. The barrel-shaped portion TP1 has a cylindrical shape and is extended along an outer circumferential surface of the lower electrode LE.

A ring-shaped portion AP is provided between the barrel-shaped portion TP1 and the focus ring FR. The ring-shaped portion AP is made of an insulating material such as alumina. The ring-shaped portion AP is annularly extended along an outer circumferential surface of the second plate 22b. A top surface of the ring-shaped portion AP is in contact with a bottom surface of the focus ring FR. Further, a bottom surface of the ring-shaped portion AP is in contact with an upper end of the barrel-shaped portion TP1.

A barrel-shaped portion TP2 is provided under a peripheral portion of the ring-shaped portion AP. The barrel-shaped portion TP2 has a substantially cylindrical shape. The barrel-shaped portion TP2 is extended along outer surfaces of the barrel-shaped portion TP1 and the supporting member SP1. The barrel-shaped portion TP2 is made of a conductive material, for example, aluminum. Further, a film made of yttria ($Y_2O_3$) may be formed on a surface of the barrel-shaped portion TP2. Alternatively, oxidation treatment may be performed on the surface of the barrel-shaped portion TP2.

A space from the outer circumferential surfaces of the barrel-shaped portion TP2 and the ring-shaped portion AP to the sidewall 12a and the shield member 60 is configured as a gas exhaust path VL. The gas exhaust path VL is extended to the bottom 12b and connected with a gas exhaust device 30 via a gas exhaust line provided at the bottom 12b. The gas exhaust device 30 has a pressure controller and a vacuum pump such as a turbo molecular pump. By operating the gas exhaust device 30, a gas can be exhausted from the space around the mounting table 20 through the gas exhaust path VL, and the processing space S within the processing vessel 12 can be decompressed to a required vacuum level.

A baffle plate BP is provided at a portion of the gas exhaust path VL in the vertical direction. The baffle plate BP is a plate-shaped member extended in a ring shape around the axis Z. The baffle plate BP is provided with a multiple number of through holes. These through holes are formed through the baffle plate BP in the vertical direction. An inner edge portion of the baffle plate BP is located between the barrel-shaped portion TP2 and the ring-shaped portion AP.

Further, an outer edge portion of the baffle plate BP is supported by the shield member 60.

Further, the plasma processing apparatus 10 is further equipped with a plasma generation unit PG and a gas supply unit GS. The plasma generation unit PG is configured to introduce, into the processing vessel 12, energy for exciting a gas supplied from the gas supply unit GS. In the exemplary embodiment, the plasma generation unit PG is provided at the ceiling 12c. As an example, the plasma generation unit PG introduces a microwave into the processing vessel 12. The plasma generation unit PG may be implemented by a capacitively coupled plasma source. In this case, the plasma generation unit PG may be configured as an upper electrode. In such a configuration where the plasma generation unit PG serves as the upper electrode, a high frequency power supply configured to generate a high frequency power for plasma generation may be connected to either one of the upper electrode and the lower electrode LE. Alternatively, the plasma generation unit PG may be configured as an inductively coupled plasma source. Still alternatively, the plasma generation unit PG may be implemented by a microwave supply unit.

The gas supply unit GS is configured to supply a gas into the processing vessel 12. This gas is excited by the energy introduced from the plasma generation unit PG, and the plasma processing is performed by the excited gas. By way of example, as shown in FIG. 1, the gas supply unit GS has a gas inlet line 50. The gas inlet line 50 is extended from the outside of the processing vessel 12 to the inside thereof. The gas inlet line 50 is connected to a gas source 52. The gas source 52 is configured to supply, at a controlled flow rate, the gas according to the plasma processing performed on the wafer W. Further, the gas supply unit GS is not limited to the example shown in FIG. 1. By way of example, the gas supply unit GS may be configured to supply the gas from the ceiling 12c instead of or in addition to from the gas inlet line 50. Furthermore, in case that the plasma generation unit PG serves as the upper electrode, the gas supply unit GS may be implemented by a shower head configured as the upper electrode.

Figure 2:
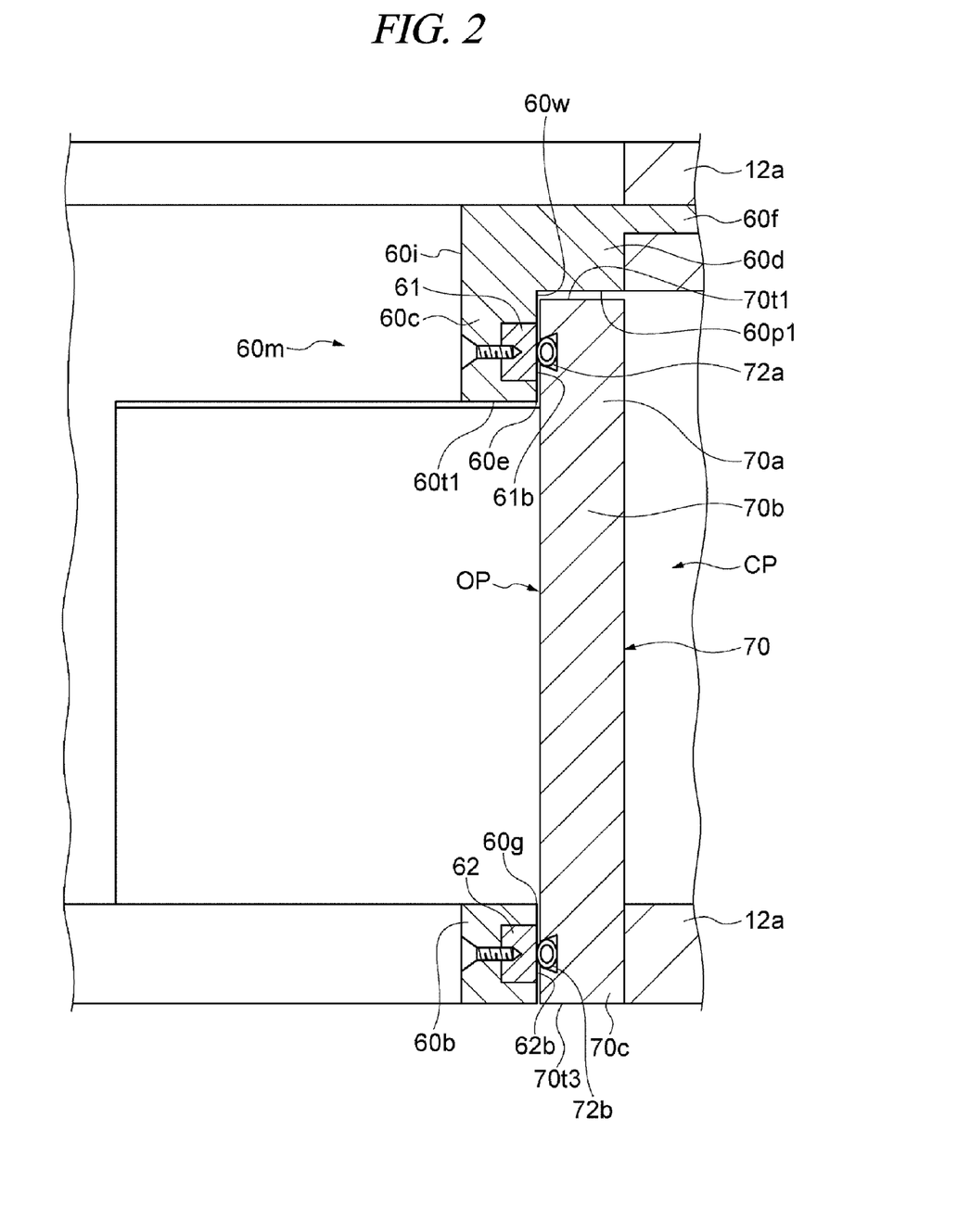
FIG. 2 is a cross sectional view illustrating a shield member and a shutter according to the exemplary embodiment.
Figure 3:
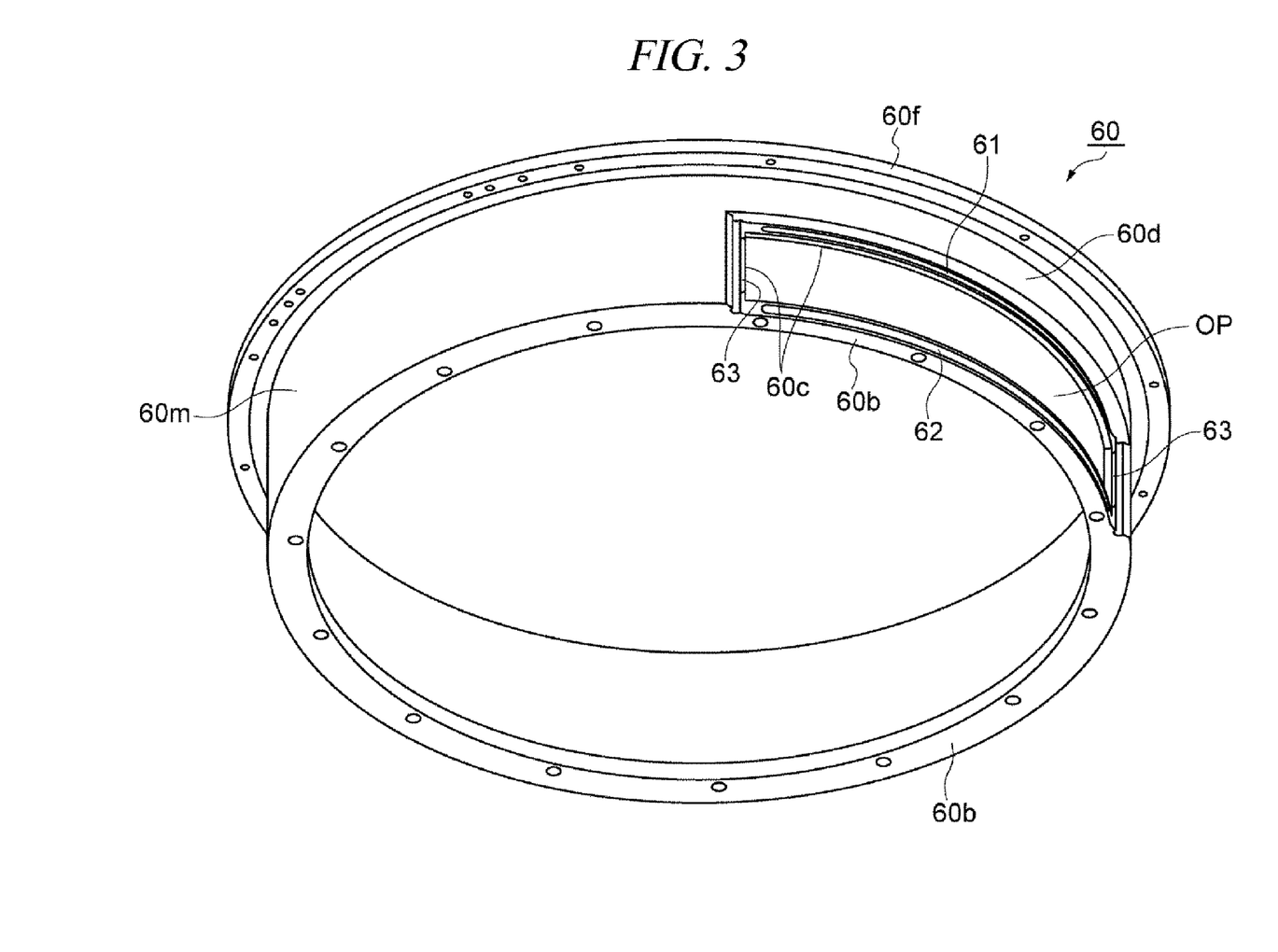
FIG. 3 is a perspective view illustrating the shield member according to the exemplary embodiment.
Figure 4:
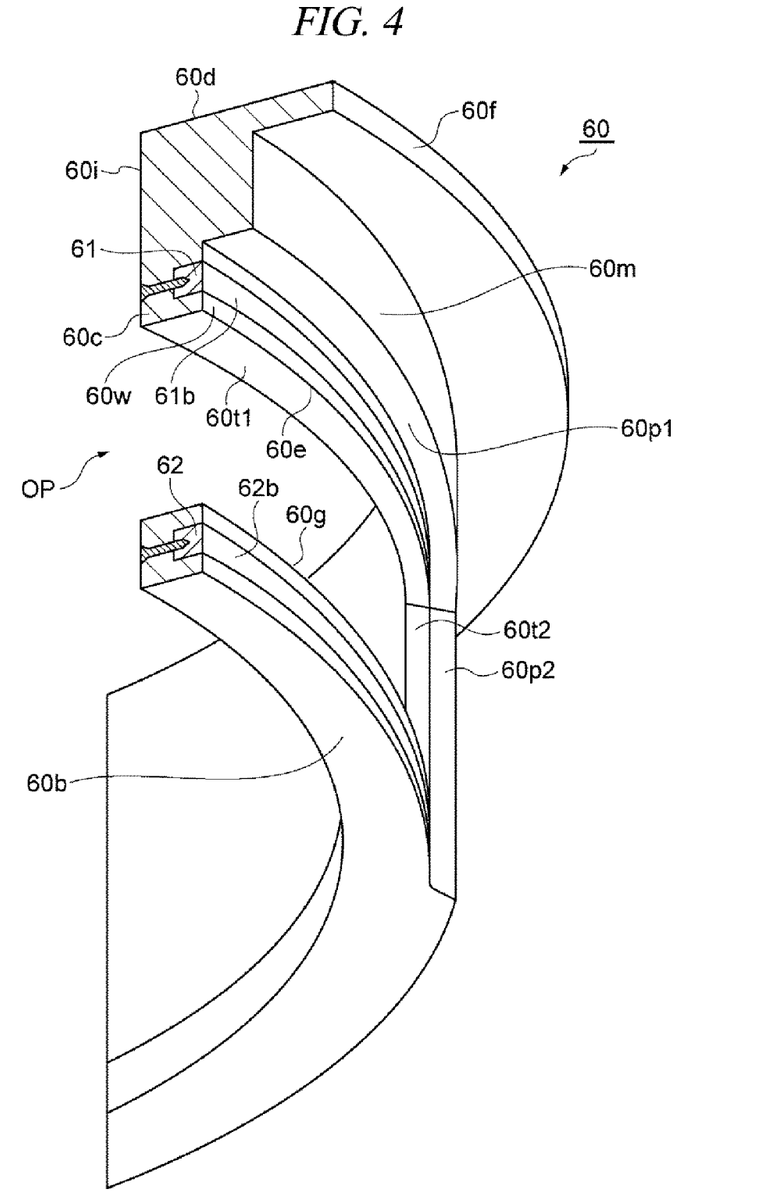
FIG. 4 is a cutaway perspective view showing an enlargement of a part of the shield member shown in FIG. 3.
Figure 5:
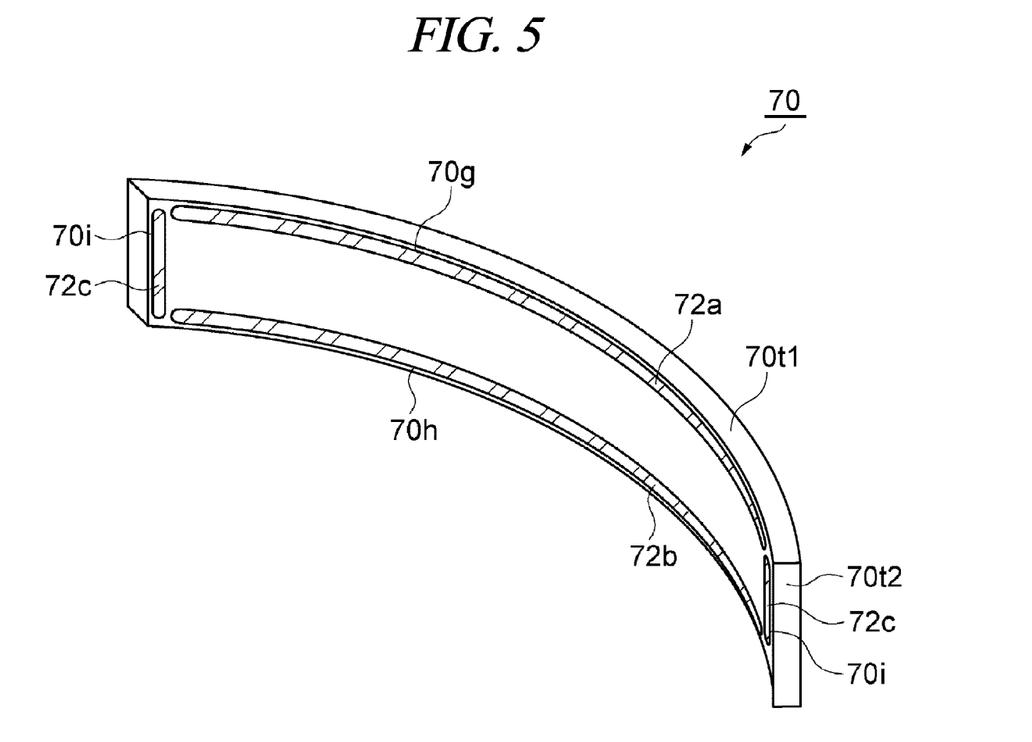
FIG. 5 is a perspective view of the shutter according to the exemplary embodiment.

Hereinafter, details of the shield member 60 and the shutter 70 will be explained. FIG. 2 is a cross sectional view illustrating the shield member and the shutter according to the exemplary embodiment, and shows a state in which the shutter is located in the second region while closing the opening of the shield member. FIG. 3 is a perspective view of the shield member according to the exemplary embodiment, and FIG. 4 is a cutaway perspective view showing an enlargement of a part of the shield member shown in FIG. 3. Further, FIG. 5 is a perspective view of the shutter according to the exemplary embodiment.

As shown in FIG. 3, the shield member 60 has a main body 60m. The main body 60m has a substantially cylindrical shape, and is provided along the sidewall 12a such that a central axis thereof substantially coincides with the axis Z, as illustrated in FIG. 1. The main body 60m is made of, by way of non-limiting example, aluminum. An yttria ($Y_2O_3$) film may be formed on a surface of the main body 60m, or oxidation treatment may be performed on the surface of the main body 60m.

According to the exemplary embodiment, as depicted in FIG. 2, FIG. 3 and FIG. 4, the main body 60m has a flange 60f. The flange 60f constitutes an uppermost portion of the main body 60m. The flange 60f expands an outer diameter of the main body 60m at the uppermost portion of the main body 60m. This flange 60f is supported by the sidewall 12a, as illustrated in FIG. 2. To elaborate, the sidewall 12a includes vertically separate two parts, and the flange 60f is embedded between these two parts.

Further, the main body 60m includes a lower portion 60b, as shown in FIG. 2, FIG. 3 and FIG. 4. The lower portion 60b constitutes a lowermost portion of the main body 60m. The lower portion 60b has a preset thickness in a height direction, that is, in a direction in which the axis Z is extended (hereinafter, referred to as "axis Z direction").

The main body 60m is provided with the opening OP. The opening OP faces the transfer path CP, as illustrated in FIG. 2. As shown in FIG. 2, FIG. 3 and FIG. 4, the main body 60m has a thin portion 60c surrounding the opening OP from above the opening OP and from both lateral sides of the opening OP in the circumferential direction. Further, the main body 60m has a thick portion 60d forming the main body 60m above the thin portion 60c and at both lateral sides of the thin portion 60c in the circumferential direction. A thickness of this thin portion 60c in the diametrical direction is thinner than a thickness of the thick portion 60d in the diametrical direction, and is set to be the same as a thickness of the lower portion 60b in the corresponding diametrical direction. Further, an inner circumferential surface of the thin portion 60c and inner circumferential surfaces of the thick portion 60d and the lower portion 60b are continuous, forming an inner circumferential surface 60i of the main body 60m. An outer circumferential surface 60w of the thin portion 60c and an outer circumferential surface of the lower portion 60b are continuous. The outer circumferential surface 60w of the thin portion 60c is closer to the axis Z than the outer circumferential surface of the thick portion 60d is.

The thin portion 60c has an end surface 60t1 and a pair of end surfaces 60t2. The end surface 60t1 is extended in the circumferential direction above the opening OP, facing downwards. Further, the pair of end surfaces 60t2 is vertically extended from both ends of the end surface 60t1 in the circumferential direction, intersecting with the circumferential direction. An edge 60e as a boundary between these end surfaces 60t1 and 60t2 and the outer circumferential surface 60w of the thin portion 60c are extended in the circumferential direction to form and confine the opening OP from above, and also vertically extended to form and confine the opening OP from the both lateral sides in the circumferential direction. Further, the opening OP is also formed and confined from below by an edge 60g of the lower portion 60b. This edge 60g constitutes an upper edge of an outer circumferential surface of the lower portion 60b.

As depicted in FIG. 4, the thick portion 60d has an end surface 60p1 and a pair of end surfaces 60p2. The end surface 60p1 is extended in the circumferential direction, facing downwards. The end surface 60p1 is extended above the end surface 60t1 and at an outer side than the end surface 60t1 in the diametrical direction. Further, the pair of end surfaces 60p2 is vertically extended from both ends of the end surface 60p1 in the circumferential direction, intersecting with the circumferential direction. The pair of end surfaces 60p2 is distanced from the opening OP farther than the pair of end surfaces 60t2 in the circumferential direction, and extended at an outer side than the pair of end surfaces 60t2 in the diametrical direction.

The outer circumferential surface of the lower portion 60b is on the same circumferential surface as the outer circumferential surface 60w of the thin portion 60c. That is, a distance of the outer circumferential surface of the lower portion 60b from the axis Z is equal to a distance of the outer circumferential surface 60w of the thin portion 60c from the axis Z. The outer circumferential surface of the lower portion 60b, the outer circumferential surface 60w of the thin portion 60c and the end surfaces 60p1 and 60p2 of the thick portion 60d form and confine a space in which the shutter 70 is accommodated.

Furthermore, as illustrated in FIG. 2 and FIG. 4, a groove extended in the circumferential direction and a pair of grooves extended in the axis Z direction are formed at the outer circumferential surface 60w of the thin portion 60c. A conductive member 61 is inserted within the groove extended in the circumferential direction. A conductive member 63 is inserted in each of the grooves extended in the axis Z direction. Outer surfaces of these conductive members 61 and 63 constitute contact surfaces 61b and 63b. Further, the conductive members 61 and 63 can be fixed to the thin portion 60c by screwing. That is, the conductive members 61 and 63 are provided detachably from the thin portion 60c. The conductive members 61 and 63 are made of, by way of example, but not limitation, an alloy (for example, Hastelloy (registered trademark)).

Likewise, a groove extended in the circumferential direction is formed at the outer circumferential surface of the lower portion 60b. A conductive member 62 is inserted within this groove. An outer surface of this conductive member 62 constitutes a contact surface 62b. Further, the conductive member 62 can be fixed to the lower portion 60b by screwing. That is, the conductive member 62 is provided detachably from the lower portion 60b. The conductive member 62 is made of, by way of non-limiting example, an alloy (for example, Hastelloy (registered trademark)).

As shown in FIG. 2, the shutter 70 has a first portion 70a, a second portion 70b and a third portion 70c. The second portion 70b is a portion facing the opening OP when the shutter 70 closes the corresponding opening OP. The shutter 70 is made of, by way of non-limiting example, aluminum. A film made of yttria ($Y_2O_3$) may be formed on a surface of the shutter 70. Alternatively, oxidation treatment may be performed on the surface of the shutter 70.

As depicted in FIG. 2 and FIG. 5, the shutter 70 has a plate shape extended in the circumferential direction. The shutter 70 has an inner surface; and an outer surface farther from the axis Z than the inner surface is. The radius of curvature of the inner surface of the shutter 70 is substantially equal to a distance from the axis Z to the opening OP. Further, the shutter 70 has an end surface 70t1, a pair of end surfaces 70t2 and an end surface 70t3. The end surface 70t1 is a surface at an upper end of the shutter 70 and extended in the circumferential direction, facing upwards. Further, the pair of end surfaces 70t2 is vertically extended from two opposite ends of the end surface 70t1 in the circumferential direction, intersecting with the circumferential direction. Further, the end surface 70t3 is a surface at a lower end of the shutter 70 and extended in the circumferential direction, facing downwards.

A groove 70g is formed at an inner circumferential surface of the first portion 70a of the shutter 70. This groove 70g is extended in the circumferential direction. A conductive member 72a is inserted in the groove 70g. This conductive member 72a may be implemented by an elastic member. The conductive member 72a is made of, by way of non-limiting example, an alloy (for example, Hastelloy (registered trademark)). As an example, the conductive member 72a may be formed to have a spiral shape around an arc extended in the circumferential direction.

A groove 70h is formed at an inner circumferential surface of the third portion 70c of the shutter 70. This groove 70h is extended in the circumferential direction. A conductive member 72b is inserted in the groove 70h. This conductive member 72b is made of, but not limited to, an alloy (for example, Hastelloy (registered trademark)). As an example, the conductive member 72b may be formed to have a spiral shape around an arc extended in the circumferential direction.

A pair of grooves 70i is formed at two opposite sides of an inner circumferential surface of the second portion 70b of the shutter 70. Each of the grooves 70i is vertically extended. A pair of conductive member 72c is respectively inserted in the grooves 70i. The conductive members 72c are made of, by way of example, an alloy (for example, Hastelloy (registered trademark)). As an example, each of the conductive members 72c is formed to have a spiral shape around a vertically extended straight line.

Although the above description has been provided for an example where the shutter 70 is equipped with the straight line-shaped conductive members respectively provided around a region of the shutter 70 corresponding to the opening OP, the shutter 70 may be equipped with an annular conductive member configured to surround the region of the shutter 70 corresponding to the opening OP. Further, the connection portion to which the driving shaft 80 for elevation is connected is provided at a lower end portion of the shutter 70.

Figure 6A:
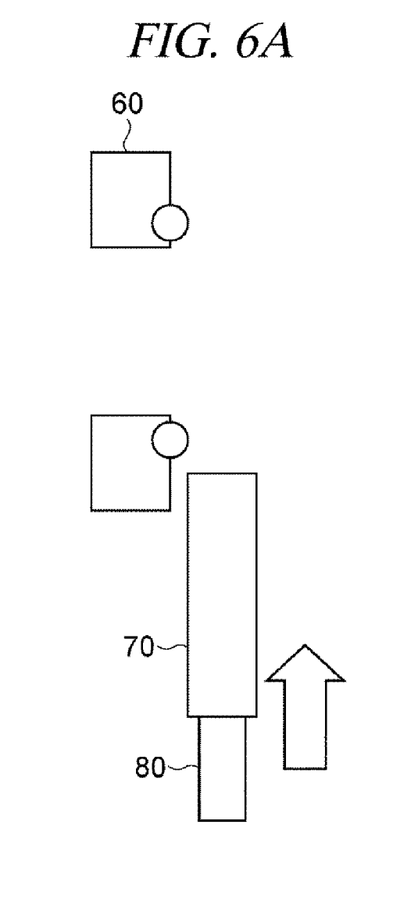
FIG. 6A to FIG. 6C are diagrams schematically illustrating an operation in which the shutter closes an opening of the shield member according to the exemplary embodiment.
Figure 6B:
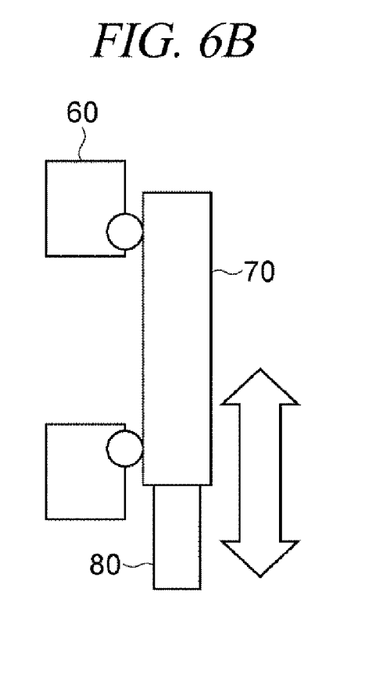
Figure 6C:
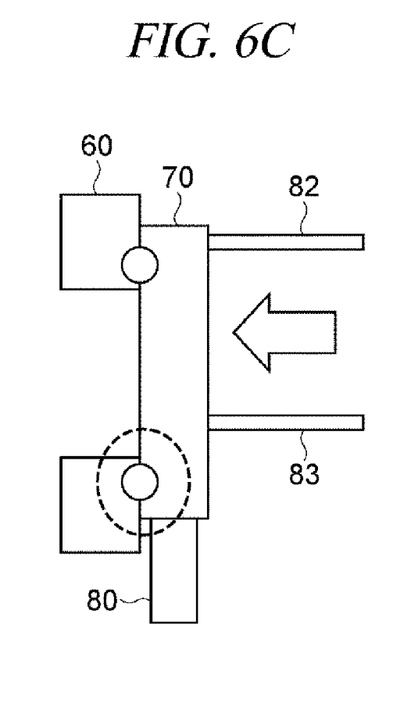

FIG. 6A to FIG. 6C depict the shutter according to the exemplary embodiment and schematically illustrate an operation in which the shutter is closing the opening of the shield member. FIG. 6A illustrates a state in which the shutter 70 is located in the first region; FIG. 6B, a state in which the shutter 70 is located in the second region; and FIG. 6C, a state in which the shutter is firmly pressed against the shield member 60. When the opening OP is closed by the shutter 70, the shutter 70 is moved by the driving shaft 80 from the first region to the second region thereabove, as illustrated in FIG. 6A and FIG. 6B. If the shutter 70 is placed in the second region, the second portion 70b of the shutter 70 faces the opening OP, as shown in FIG. 2. In this state, the end surface 70t1 of the first portion 70a faces the end surface 60p1 of the shield member 60 with a gap therebetween. Further, each of the pair of end surfaces 70t2 of the shutter 70 faces corresponding one of the end surfaces 60p2 of the shield member 60 with a gap therebetween. Furthermore, the inner circumferential surface of the first portion 70a and the second portion 70b of the shutter 70 face the outer circumferential surface 60w of the thin portion 60c of the shield member 60 with a gap therebetween in the diametrical direction. Furthermore, the inner circumferential surface of the third portion 70c of the shutter 70 faces the outer circumferential surface of the lower portion 60b of the shield member 60 with a gap therebetween in the diametrical direction. Accordingly, a gap of a labyrinth structure is formed above and under the opening OP and at the both lateral sides of the opening OP in the circumferential direction. Further, the first portion 70a and both lateral sides of the second portion 70b of the shutter 70 face the outer circumferential surface 60w of the thin portion 60c of the shield member 60 from the outside in the diametrical direction, and the third portion 70c of the shutter 70 faces the outer circumferential surface of the lower portion 60b of the shield member 60 from the outside in the diametrical direction.

In the state shown in FIG. 6B, the shutter 70 located in the second region is pressed toward the shield member 60 by the upper driving shaft 82 and the lower driving shaft 83, as depicted in FIG. 6C. Accordingly, the conductive members 72a, 72b and 72c come into secure contact with the contact surfaces 61b, 62b and 63b, respectively. As stated, the shutter 70 and the shield member 60 are firmly in contact with each other at the conductive members 72a, 72b and 72c and the contact surfaces 61b, 62b and 63b, respectively, and the shutter 70 and the shield member 60 are electrically connected along the entire edge of the opening OP. Thus, the electrical connection between the shutter 70 and the shield member 60 can be stabilized. Therefore, a plasma leakage during the plasma processing or the like is suppressed, so that a more uniform plasma space can be achieved.

Further, according to the shutter 70, when the conductive members 72a, 72b and 72c are consumed (worn), only the conductive members 72a, 72b and 72c can be replaced. Accordingly, as compare to the configuration in which the entire shutter 70 is made of the conductive member such as Hastelloy (registered trademark), the cost of the shutter 70 can be reduced.

Moreover, to open the opening OP, the driving device 45 first releases the pressing of the shutter 70 by the upper driving shaft 82 and the lower driving shaft 83. Then, the shutter 70 is moved down by the driving shaft 80 and returned back into the first region from the second region. As a result, the opening OP is opened.

As stated above, in the plasma processing apparatus 10 according to the exemplary embodiment, the shutter 70 is moved up and down by the driving device 40 and also moved by the driving device 45 in the forward-backward direction with respect to the shield member 60. For example, when the opening OP is closed, the shutter 70 is moved by the driving device 40 up to the position where the shutter 70 faces the opening OP. At this position, the shutter 70 is moved to approach the shield member 60 by the driving device 45, and is firmly pressed against the shield member 60. As stated, by providing the driving device 45, the shutter 70 can be brought into contact with the shield member 60, so that the electrical connection between the shutter 70 and the shield member 60 can be stabilized. Therefore, the uniform plasma space can be formed in the plasma processing apparatus 10.

Furthermore, the driving device 40 has the driving shaft 80 which is connected to the connection portion of the shutter 70 and configured to move the shutter 70 up and down, and the lower driving shaft 83 presses this connection portion. Therefore, as compared to the case where a portion of the shutter 70 other than the connection portion is pressed, a stress generated at the connection portion between the shutter 70 and the driving shaft 80 can be reduced.

Besides, the driving device 45 is equipped with the driving shafts 82 and 83 configured to press the shutter 70. Therefore, as compare to the case where the single driving shaft presses the shutter 70, the shutter 70 can be firmly pressed against the shield member 60 in a uniform manner.

In addition, the plasma processing apparatus 10 is equipped with the conductive members 61, 62 and 63 provided at the shield member 60 to surround the opening OP. Accordingly, since the shutter 70 and the shield member 60 are electrically connected along the entire edge of the opening OP, the electrical connection between the shutter 70 and the shield member 60 can be further stabilized.

Moreover, the plasma processing apparatus 10 is equipped with the conductive members 72a, 72b and 72c provided at the shutter 70 to surround the region of the shutter 70 corresponding to the opening OP. Accordingly, since the shutter 70 and the shield member 60 are electrically connected along the entire edge of the opening OP, the electrical connection between the shutter 70 and the shield member 60 can be further stabilized.

So far, the various exemplary embodiments have been described. However, the above-described exemplary embodiments are not limiting, and various changes and modifications may be made.

By way of example, the driving device 40 may be equipped with a multiple number of driving shafts 80. The driving device 45 may be equipped with either one of the upper driving shaft 82 and the lower driving shaft 83, or may be equipped with an additional driving shaft.

Further, in the above-described exemplary embodiments, the shutter 70 is accommodated in the space formed within the shield member 60. However, the shutter 70 may be disposed at an outside of the shield member 60. In such a case, a gap for avoiding interference need not be provided at the lateral sides of the shutter 70.

From the foregoing, it will be appreciated that the exemplary embodiment of the present disclosure has been described herein for purposes of illustration, and that various modifications may be made without departing from the scope and spirit of the present disclosure. Accordingly, the embodiment disclosed herein is not intended to be limiting. The scope of the inventive concept is defined by the following claims and their equivalents rather than by the detailed description of the exemplary embodiment. It shall be understood that all modifications and embodiments conceived from the meaning and scope of the claims and their equivalents are included in the scope of the inventive concept.

I claim:

1. A plasma processing apparatus configured to perform a plasma processing on a processing target object, the plasma processing apparatus comprising:
    a processing vessel having a sidewall, the sidewall having therein a first opening through which the processing target object is carried-in and carried-out;
    a mounting table provided within the processing vessel;
    a shield member provided along an inner surface of the sidewall to surround the mounting table and provided with a second opening facing the first opening, wherein the shield member includes first upper and lower conductive members and first right and left conductive members and, each first conductive member inserted into a respective groove formed around the second opening on the shield member;
    a shutter for the second opening of the shield member configured to be moved up and down;
    a first driving unit configured to move the shutter up and down; and
    a second driving unit configured to move the shutter in a forward and backward direction with respect to the shield member,
    wherein the first driving unit is equipped with a first driving shaft which is directly connected to a bottom surface of a connection portion of the shutter and is configured to move the shutter up and down,
    the second driving unit is equipped with a second upper driving shaft being connectable to an upper side surface of the shutter in order to press the shutter against the shield member and a second lower driving shaft being connectable to a lower side surface of the shutter in order to press the shutter against the shield member,
    the second upper driving shaft and the second lower driving shaft are disposed within the first opening that is disposed within the sidewall, and
    the second lower driving shaft is disposed to be able to press the connection portion of the shutter, wherein the shutter includes second upper and lower conductive members and second right and left conductive members, the first and second conductive members being formed of an alloy to stabilize an electrical connection between the shutter and the shield member, wherein when the shutter is pressed against the shield member by the second upper and lower driving shafts, each of the second upper and lower conductive members contacts each of the first upper and lower conductive members, respectively, and each of the second right and left conductive members contacts each of the first right and left conductive members, respectively, to suppress a plasma leakage.

2. The plasma processing apparatus of claim 1, wherein the first driving unit is equipped with multiple elevation driving shafts.

3. The plasma processing apparatus of claim 1, wherein the shutter is disposed at an outside of the shield member.

4. The plasma processing apparatus of claim 1, wherein a film made of yttria is formed on a surface of the shutter or oxidation treatment is performed on the surface of the shutter.

5. The plasma processing apparatus of claim 1, wherein a film made of yttria is formed on a surface of a main body of the shield member or oxidation treatment is performed on the surface of the main body of the shield member.

6. The plasma processing apparatus of claim 1, wherein the second upper and lower conductive members and the second right and left conductive members are formed to have a spiral shape around an arc extended in a circumferential direction of the shutter.

7. The plasma processing apparatus of claim 1, wherein the second upper and lower conductive members and the second right and left conductive members are arranged in an annular shape.

8. The plasma processing apparatus of claim 1, wherein the first upper and lower conductive members and the first right and left conductive members are provided detachably from the shield member.

9. The plasma processing apparatus of claim 1, wherein the first upper and lower conductive members and the first right and left conductive members are fixed to the shield member by screwing.

10. A plasma processing apparatus configured to perform a plasma processing on a processing target object, the plasma processing apparatus comprising:

a processing vessel having a sidewall, the sidewall having therein a first opening through which the processing target object is carried-in and carried-out;

a mounting table provided within the processing vessel;

a shield member provided along an inner surface of the sidewall to surround the mounting table and provided with a second opening facing the first opening, wherein the shield member includes first upper and lower conductive members and first right and left conductive members and, each first conductive member inserted into a respective groove formed around the second opening on the shield member;

a shutter for the second opening of the shield member configured to be moved up and down; and a driving unit configured to move, when closing the second opening, the shutter up from a first region lower than the second opening to a second region which faces the second opening with a gap therebetween and press the shutter located at the second region toward the shield member, and configured to release, when opening the second opening, the pressing of the shutter toward the shield member and move the shutter down to the first region, wherein the driving unit is equipped with a first driving shaft which is directly connected to a bottom surface of a connection portion of the shutter and is configured to move the shutter up and down, the driving unit is equipped with a second upper driving shaft being connectable to an upper side surface of the shutter in order to press the shutter against the shield member and a second lower driving shaft being connectable to a lower side surface of the shutter in order to press the shutter against the shield member, the second upper driving shaft and the second lower driving shaft are disposed within the first opening that is disposed within the sidewall, and the second lower driving shaft is disposed to be able to press the connection portion of the shutter, wherein the shutter includes second upper and lower conductive members and second right and left conductive members, the first and second conductive members being formed of an alloy to stabilize an electrical connection between the shutter and the shield member, wherein when the shutter is pressed against the shield member by the second upper and lower driving shafts, each of the second upper and lower conductive members contacts each of the first upper and lower conductive members, respectively, and each of the second right and left conductive members contacts each of the first right and left conductive members, respectively, to suppress a plasma leakage.

* * * * *